(12) United States Patent
Leu

(10) Patent No.: US 6,395,590 B1
(45) Date of Patent: May 28, 2002

(54) CAPACITOR PLATE FORMATION IN A MIXED ANALOG-NONVOLATILE MEMORY DEVICE

(75) Inventor: Len-Yi Leu, Hsinchu (TW)

(73) Assignee: Winbond Electronics Corporation (TW)

( * ) Notice: Subject to any disclaimer, the term of this patent is extended or adjusted under 35 U.S.C. 154(b) by 17 days.

(21) Appl. No.: 09/639,008

(22) Filed: Aug. 15, 2000

(51) Int. Cl.⁷ .............................................. H01L 21/337
(52) U.S. Cl. ...................... 438/186; 438/238; 438/384; 357/23.6; 357/41; 357/51; 357/59
(58) Field of Search ................................ 438/186, 384, 438/238; 357/23.6, 41, 51, 59

(56) References Cited

U.S. PATENT DOCUMENTS

| | | | | |
|---|---|---|---|---|
| 4,142,926 A | * | 3/1979 | Morgan ....................... 148/187 |
| 4,622,570 A | * | 11/1986 | Taguchi ....................... 357/23.6 |
| 4,907,046 A | * | 3/1990 | Ohji et al. .................. 357/23.6 |
| 5,618,749 A | * | 4/1997 | Takahashi et al. .......... 438/384 |

\* cited by examiner

Primary Examiner—Michael S. Lebentritt
Assistant Examiner—Pho M. Luu
(74) Attorney, Agent, or Firm—Proskauer Rose, LLP

(57) ABSTRACT

A process is provided for manufacturing a semiconductor device. A lower polycrystalline silicon layer is deposited on a substrate surface and on one or more structures that protrude from the substrate surface. A dielectric layer is formed on the lower polycrystalline silicon layer. An upper polycrystalline silicon layer is deposited on the dielectric layer. The upper polycrystalline silicon layer is patterned to form one or more upper capacitor plates. Next, the exposed portions of the dielectric layer not covered by the one or more upper capacitor plates are removed. After the steps of patterning the upper polycrystalline silicon area and removing the exposed portions of the dielectric layer, the lower polycrystalline silicon layer is patterned to form at least one or more lower capacitor plates. Each lower capacitor plate underlies a corresponding one of the upper capacitor plates and a portion of the dielectric layer covered by the corresponding upper capacitor plate.

9 Claims, 5 Drawing Sheets

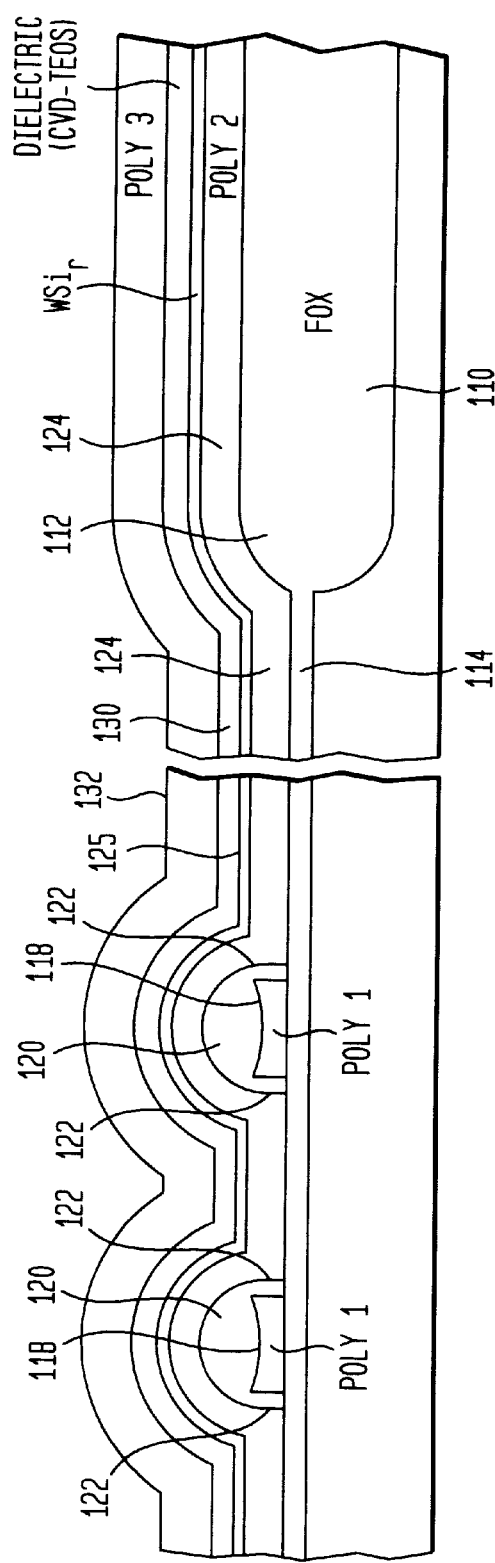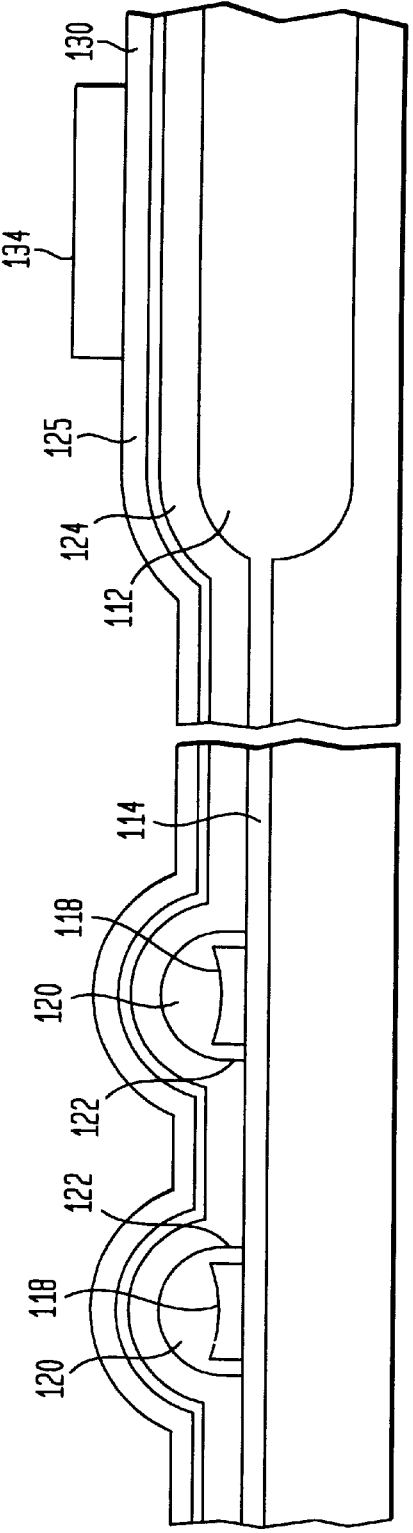

CAPACITOR PLATE FORMATION IN A MIXED ANALOG-NONVOLATILE MEMORY DEVICE

FIELD OF THE INVENTION

The present invention pertains to semiconductor integrated circuits. In particular, the present invention pertains to an integrated circuit including a nonvolatile memory and a capacitor used as an analog device.

BACKGROUND OF THE INVENTION

It is often desirable to provide both memory circuitry and analog circuitry on the same integrated circuit. One such desirable integrated circuit may include a nonvolatile memory, such as an EPROM, EEPROM or flash memory, and a so-called low voltage coefficient capacitor. A low voltage coefficient capacitor is a capacitor whose capacitance and/or resistance does not significantly vary with an applied voltage. This is an important characteristic for analog applications and it primarily determines the performance of analog circuits. For example, a parasitic capacitor formed from a depletion region is generally not considered to be a low voltage coefficient capacitor because the capacitance value of such a capacitor is a function of the depletion region, which in turn, is sensitive to the applied voltage. An example of a low voltage coefficient capacitor includes two polycrystalline silicon (poly) capacitor plates separated by a dielectric layer. For both polysilicon electrode plates, the doping level should be very high to avoid the degradation of capacitor voltage coefficient due to the contribution of parasitic depletion capacitance inside the polysilicon films.

FIG. 1 shows a prior art plate capacitor. This capacitor has a top-poly-electrode 15 and a bottom-poly-electrode 13 having an edge 19. As shown, the electrodes 15 and 13 are offset such the edge 19 of bottom-poly-electrode 13 is overlapped by top-poly-electrode 15. Further, this prior art plate capacitor includes substrate 10 (e.g., having an n⁻ conductivity), a contact diffusion region 11 (e.g., having a p⁺ conductivity), a field oxide region 12, a dielectric capacitor 14, an interlayer dielectric 18, metal contact regions 16, and a passivation layer 17 (e.g., formed of glass). The configuration of FIG. 1 provides simple connection of metal contacts to each electrode 15 and 13 without risk of short circuit between the electrodes 15 and 13.

For most of the common nonvolatile memory processes, double polysilicon films are utilized for the memory cells—the first polysilicon for the floating gate and the second polysilicon (normally with metal silicide on top) for the control gate. Unfortunately, the first polysilicon is usually lightly doped to ensure the quality and reliability for the gate oxide beneath the floating gate and for the interpoly dielectric (e.g. ONO layer) between the floating gates and control gates. As a result, with the second polysilicon as the bottom electrode plate and interpoly capacitor, the additional third polysilicon film has to serve as the top electrode plate. In other words, the complicated triple polysilicon process becomes inevitable for the embedded non-volatile memory products in analog applications.

However, formation of such a poly capacitor can be difficult in certain applications. FIGS. 2–6 illustrate a proposed manner of forming such a device. Illustratively, the device formed includes one or more nonvolatile memory cells similar to those designed by Silicon Storage Technologies™. See U.S. Pat. No. 5,242,848. First, a field oxide 12 is formed, e.g., using the well-known LOCOS (local oxidation of silicon) process. According to such a process, a nitride layer such as $Si_3N_4$ is deposited on the Si substrate 10, and windows are patterned in the nitride layer in the vicinity at which the field oxide regions are to be formed. The substrate is then heated in the presence of oxygen.

Next, a gate oxide region 14 is deposited or grown on the substrate 10 surface. Then, a first poly layer 16 (poly 1) is deposited on the gate oxide 14. As shown in FIG. 3, the poly layer 16 is patterned to form poly floating gates 18. The poly floating gates 18 typically must be lightly doped. Referring to FIG. 4, poly oxides 20 are grown on the poly floating gates 18 using a second LOCOS step. A thin oxide having dielectric spacers 22 (such as $SiO_2$, $Si_3N_4$ or ONO) are also formed on the side surfaces of the poly floating gates 18. Then, a second poly layer 24 (poly2) is deposited on the substrate, i.e., so as to cover the spacers 22, field oxide 12 and poly oxide 20, and gate oxide 14. A metal silicide may also be formed on the poly 2 layer 24 (not shown).

As shown in FIG. 5, the second poly layer is patterned to form control gates 26 on the poly oxides 20 and one of the spacers 22 of each cell. The patterning step also forms a bottom or lower capacitor plate 28 on the field oxide 12. A dielectric layer 30, such as a chemical vapor deposition (CVD) tetraethylorthosilicate (TEOS), CVD-ONO, or other high dielectric materials (e.g., $Ta_2O_5$, etc.) is then deposited on the substrate surface so as to cover the lower capacitor plate 28, field oxides 12 and 20, control gates 26, spacers 22 and gate oxide 14. Then, a third poly layer 32 (poly 3) is formed on the dielectric layer.

As shown in FIG. 6, the poly 3 layer 32 is patterned to form the top or upper capacitor plate 34. Then, the dielectric layer 30 is patterned to form the dielectric region 36 on the capacitor plate 28. Additional steps may be performed for forming the source and drain regions of the memory cells 38, which are not described herein.

The above proposed process for fabricating the combined nonvolatile memory cell and capacitor, however, is difficult to implement for several reasons. First, as shown in FIG. 5, the dielectric layer 30 is applied directly on top of the exposed portions of the gate oxide 15 in peripheral CMOS devices. The dielectric layer 30 is patterned by etching away the unwanted portions of the dielectric layer 30 using a wet etchant. As shown in FIG. 7, this can undercut the oxide 14 in a vicinity of a CMOS gate 40.

More importantly, the overall topographical height by which the memory cell structures protrude from the substrate surface make it very difficult to pattern the poly 3 layer in forming the upper capacitor plate. This is illustrated in FIGS. 8 and 9. FIG. 8 shows an overhead view of a nonvolatile memory cell formed according to the prior art. FIG. 9 shows a cross section through the line A—A' after the poly 3 layer 32 and dielectric layer 30 have been deposited and prior to patterning the upper capacitor plate and dielectric region. This corresponds to the highest topological height or profile of the substrate prior to the patterning of the poly 3 layer 32. As can be seen, part of the floating gate 18 and poly oxide region 20 overlie a field oxide region 42. In order to describe the topographical issues more clearly, each file thickness is assigned to have a typical value. Here, the average thickness of the poly 3 layer 32 is about a=2700 Å. The average thickness of the dielectric layer 30 (in this example, a CVD-TEOS material) is b=450 Å. The average thickness of the poly 2 control gate 26 is c=3200 Å. The average thickness of the middle of the gate poly oxide region 20 is d=2200 Å. The average thickness of the middle of the floating gate 18 is 500 Å. The height of the field oxide region 42 above the gate oxide layer 14 (which is the lowest point on the substrate surface to which the poly 3 layer 32 and the dielectric layer 30 must be etched) is f=3000 Å.

In patterning the poly 3 layer 32 and the dielectric layer 30, a photoresist material is coated onto the substrate surface. A light beam is then passed through a photolithographic mask which exposes selected portions of the photoresist to the light beam. The non-exposed portions of the photoresist material are then removed. The remaining photoresist portions act as a mask to protect the underlying region from exposure to an etching agent.

In order to properly expose the photoresist material, the light beam must be focused onto a particular area at a certain height or distance normal to the substrate surface. However, due to the high topological variation in the substrate surface height, which variation can be as high as 0.9 μm, it is difficult to focus the light beam at a suitable distance from the substrate surface. This is because some focus distance in the range of the 0.9 μm height variation must be chosen which will be suitable for some portions of the photoresist and unsuitable for others. As such, the photo window becomes very narrow.

Next, consider that the poly 3 layer 32 must be plasma etched. The portion 32' of the poly 3 layer is much thicker (e.g., a+b+c+d+e+f=1,600 Å) than the portion 32" of the poly 3 layer (e.g., only a=2700 Å) by a factor of almost 4×. In order to ensure that no poly stringers remain, the poly 3 layer 32 must be over etched by a factor of as much as 500% or more. This tends to damage the dielectric region of the capacitor and the underlying upper capacitor plate.

It is an object of the present invention to overcome the disadvantages of the prior art.

SUMMARY OF THE INVENTION

The invention achieves the above noted object as well as other objects. According to one embodiment, a process is provided for manufacturing a semiconductor device. A lower polycrystalline silicon layer is deposited on a substrate surface and on one or more structures that protrude from the substrate surface. A dielectric layer is formed on the lower polycrystalline silicon layer. An upper polycrystalline silicon layer is deposited on the dielectric layer. The upper polycrystalline silicon layer is patterned to form one or more upper capacitor plates. Next, the exposed portions of the dielectric layer not covered by the one or more upper capacitor plates are removed. After the steps of patterning the upper polycrystalline silicon area and removing the exposed portions of the dielectric layer, the lower polycrystalline silicon layer is patterned to form at least one or more lower capacitor plates. Each lower capacitor plate underlies a corresponding one of the upper capacitor plates and a portion of the dielectric layer covered by the corresponding upper capacitor plate.

Thus, according to the invention, the upper capacitor plate is patterned first, then the exposed portions of the dielectric layer are removed, followed by patterning the lower capacitor plate. Illustratively, such reverse order patterning is possible provided that the upper capacitor plate is made smaller than the lower capacitor plate. By reversing the order in which the plates and dielectric are patterned, the variance in topological height of the to-be-patterned layers during fabrication is reduced. In addition, the lower poly layer from which the lower capacitor plate is formed protects underlying structures and layers, most notably, the thin gate oxide layer of peripheral CMOS device, from etching induced damage that can occur while etching the layer above the lower poly layer, such as the dielectric layer

BRIEF DESCRIPTION OF THE DRAWINGS

FIGS. 10–13 show a fabrication process according to an embodiment of the present invention.

DETAILED DESCRIPTION OF THE INVENTION

The invention will be illustrated herein in an application employing a poly plate capacitor and flash memory cells. It should be appreciated that the present invention may be employed in other applications where multiple thick layer components or structures are to be formed on a semiconductor substrate which has other structures that protrude from the substrate surface.

Figure 1:
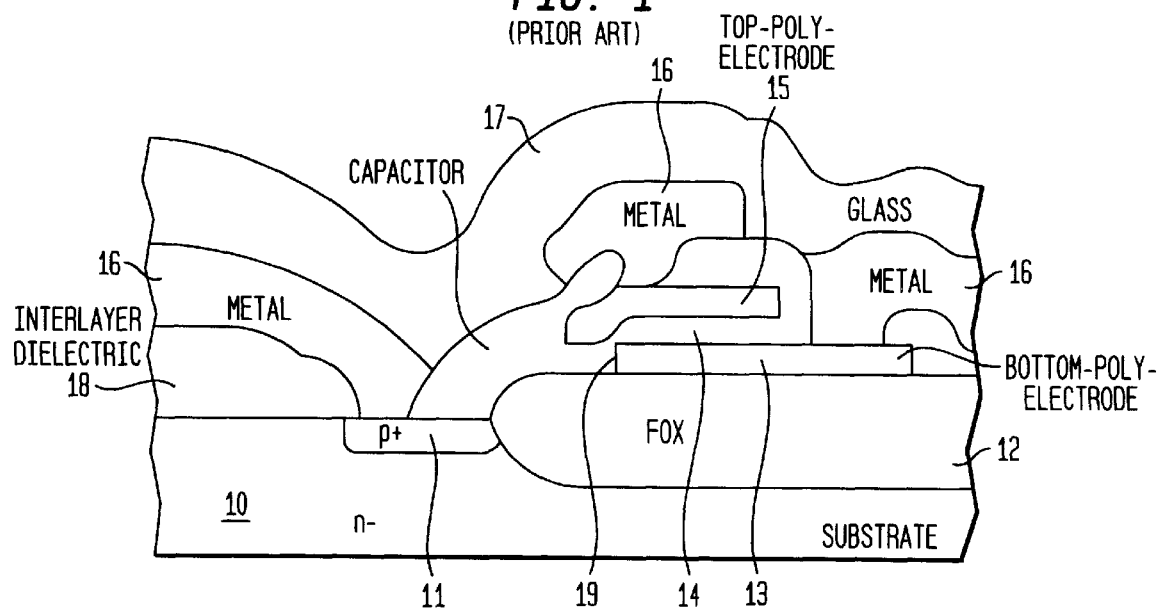
FIG. 1 shows a prior art capacitor structure with overlapping capacitor plates.
Figure 2:
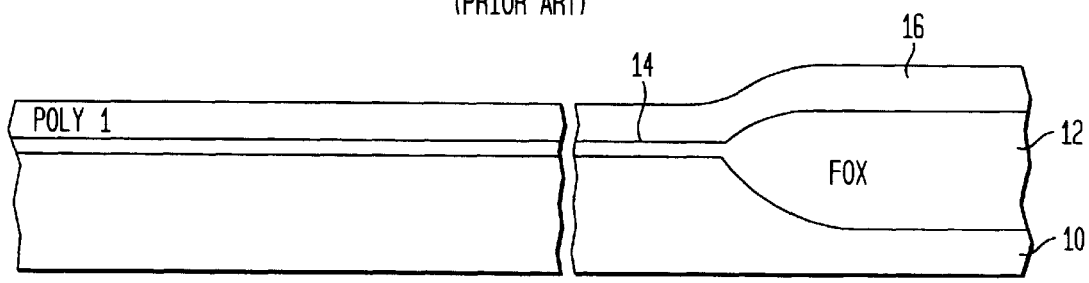
FIGS. 2–6 show a proposed prior art fabrication process for forming a nonvolatile memory and capacitor.
Figure 3:
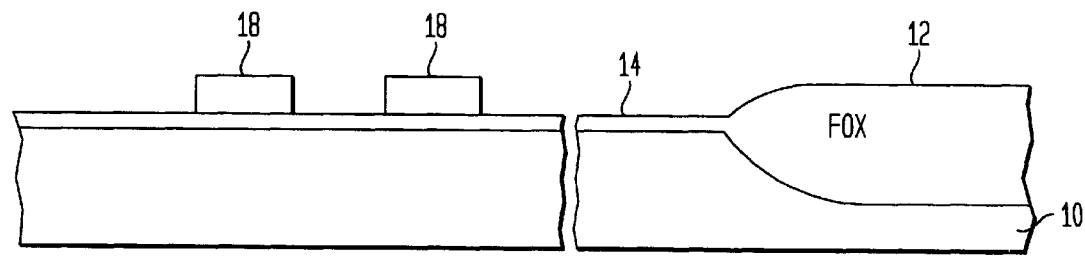
Figure 4:
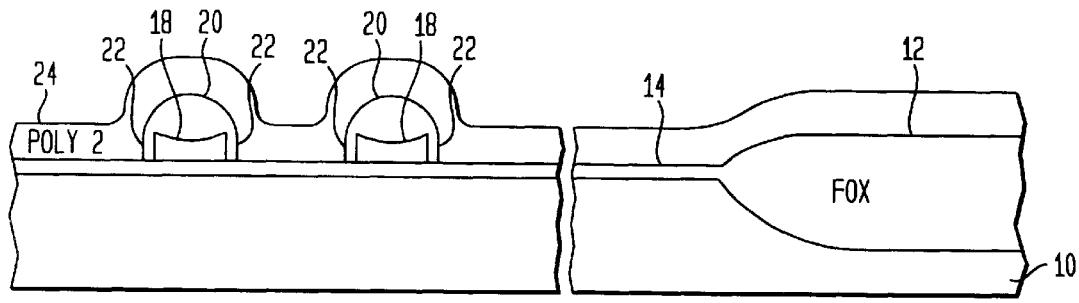

FIG. 10 shows a process for fabricating a combined nonvolatile memory and capacitor according to the present invention. For sake of brevity, some of the fabrication steps are not described but may be the same as those described in connection with FIGS. 2–4 above. As shown in FIG. 10, a field oxide 112 and a tunnel gate oxide layer 114 are formed on a substrate surface, the field oxide extending below the original surface of the substrate 110. Floating gates 118 are formed from a poly 1 layer which is lightly doped. Poly oxides 120 are formed on top of the floating gates 118 and spacers 122 are formed on the sidewalls of the floating gates 118. Then, a poly 2 layer 124 is deposited on the substrate surface so as to cover the floating gate-field oxideside wall spacer structures 118, 120, 122, the exposed portions of the remaining tunnel oxide layer 114 and the field oxide 112. Preferably, the thickness of the poly 2 layer 124 is about 2,000 Å. The poly 2 layer 124 is illustratively heavily doped n$^+$, with impurities such as arsenic or phosphorus, to an impurity concentration of about $10^{18}$–$10^{20}$ cm$^{-3}$. Preferably, a 1,200 Å tungsten silicide (WSi$_x$) layer 125 is then formed on the surface of the poly 2 layer 124, e.g., by chemical vapor deposition based on SiH$_4$/WF$_6$ process.

Unlike the process shown in FIGS. 2–6, the poly 2 layer 124 is not patterned next. Rather, as shown in FIG. 10, a dielectric layer 130 is formed on the poly 2 layer 124 (and WSi$_x$ layer 125). Illustratively, the dielectric layer 130 is a CVD-TEOS layer deposited on the WSi$_x$/poly 2 layer 124, 125 to a thickness in the range of about 150–500 Å. However, a CVD-ONO layer or other high dielectric materials (e.g., Ta$_2$O$_5$, etc.) can also be deposited as the dielectric layer 130. The dielectric layer 130 is then densified to improve the oxide quality. This can be achieved by, for example, heating the substrate to 900° C. in nitrogen for 15 minutes. Preferably, the additional thermal cycle needed to form and densify the dielectric layer 130 are minimized so as to avoid changing the performance of the memory cells.

Next, a poly 3 layer 132 is deposited on the dielectric layer 130. Preferably, the deposited poly 3 layer 132 has a thickness of 1000–4000 Å. The poly 3 layer 132 is then preferably heavily doped n$^+$ to an impurity concentration of $10^{19}$–$10^{20}$ cm$^{-3}$ by diffusing phosphorous impurities. Illustratively, this can be achieved by heating the substrate to about 850° C. in the presence of POCl$_3$ for about 40 minutes.

Next, the poly 3 layer 132 is patterned using a photolithographic and etching process. Illustratively, a dry plasma etch is performed using $CF_4$, $Cl_2$ and/or HBr as an etchant. This forms an upper capacitor plate 134 as shown in FIG. 11.

Figure 12:
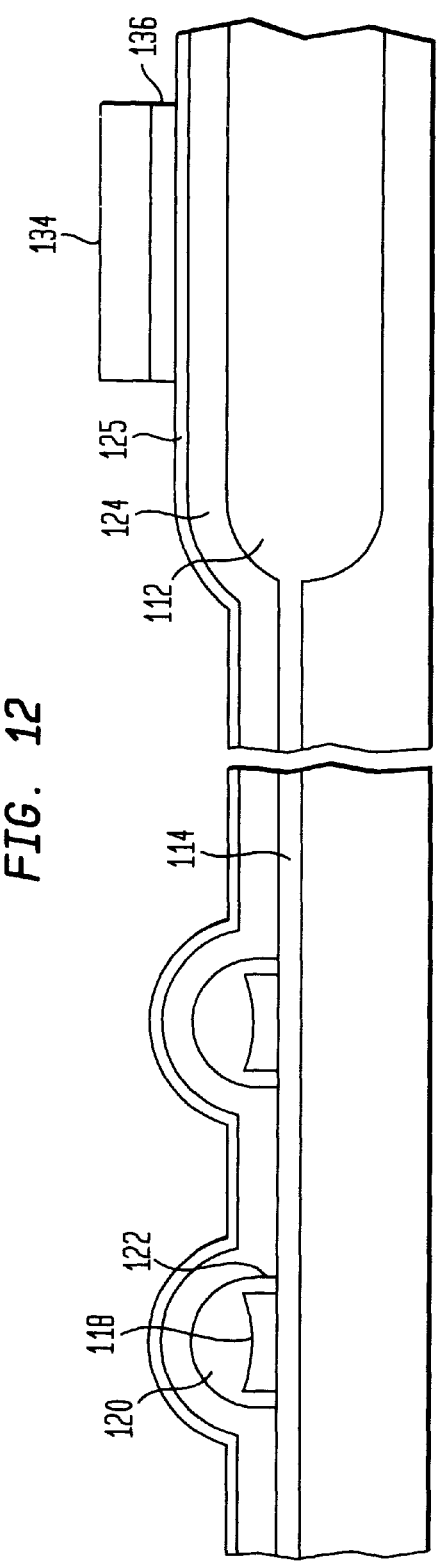

As shown in FIG. 12, the portions of the dielectric 130 not covered by the upper capacitor plate 134 are then removed. This can be achieved using a 100:1 HF wet dip. As a result, the dielectric region 136 is formed.

Figure 13:
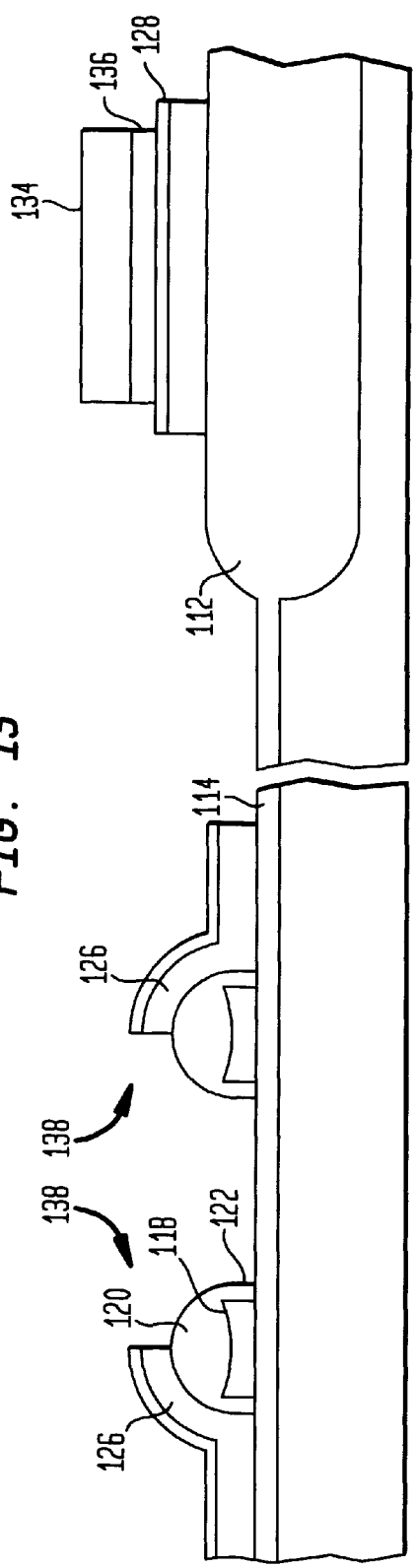

Then, as shown in FIG. 13, the poly 2 layer 124/$WSi_x$ layer 125 are patterned using a photolithographic and etching process to form both the lower capacitor plate 128 and the control gates 126 on the flash cells 138. (Note that both the lower capacitor plate 128 and the control gates 126 are shown as including both a poly 2 region and a $WSi_x$ region disposed thereon.) Conventional back end and contact formation processes may then be performed.

Figure 5:
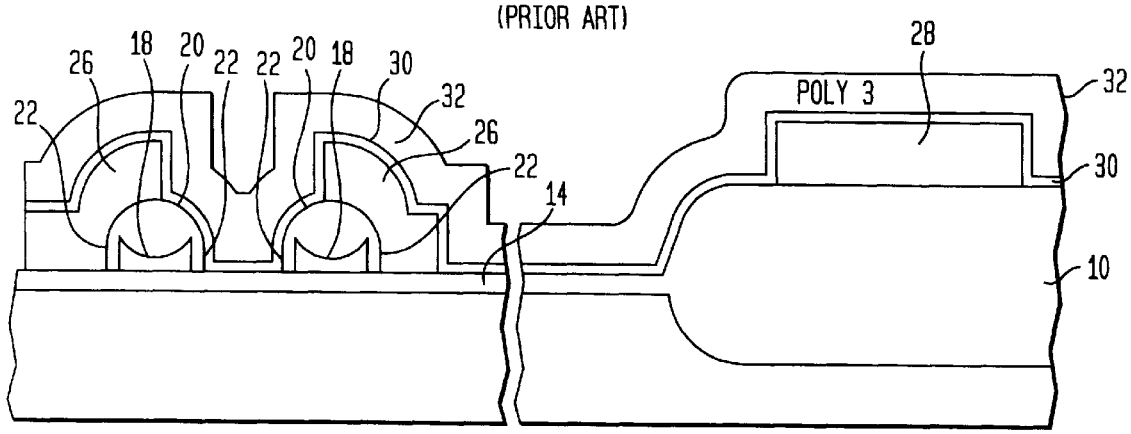
Figure 6:
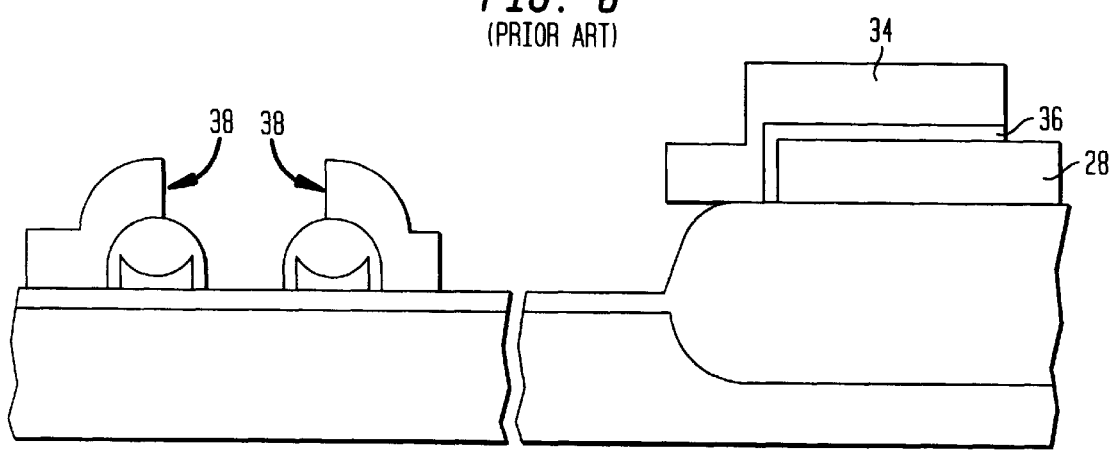
Figure 7:
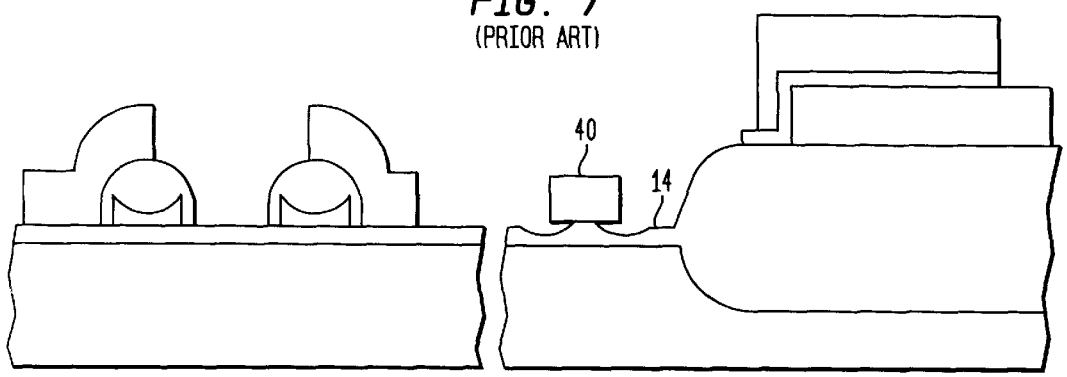
FIG. 7 shows a gate oxide under etch problem.
Figure 8:
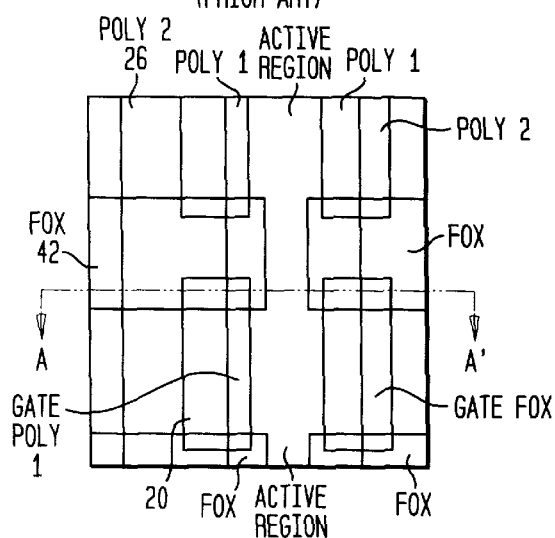
FIG. 8 shows an overhead view of the proposed prior art structure prior to etching the poly 3 layer.
Figure 9:
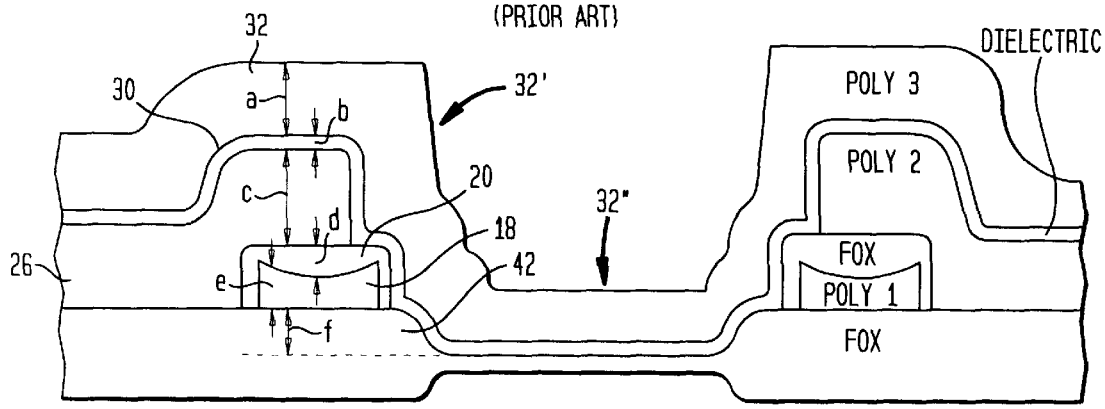
FIG. 9 shows the cross-sectional view of the proposed prior art structure of FIG. 8.

Consider that when the poly 3 layer 132 is patterned, the variation in the height of the substrate surface is much less than that shown in FIGS. 5 and 9. Specifically, in FIG. 9, the minimum height above the substrate 10 surface occurs at the locations 32" of the substrate 10 where the poly 3 layer 32 is directly on top of only the remaining tunnel oxide 14. In contrast, in FIG. 10, the minimum height locations of the substrate 110 are where the poly 3 layer 132 is disposed on the dielectric layer 130 and the poly 2 layer 124 (and $WSi_x$ layer 125, if present) as well as the remaining tunnel oxide 114. The variation in height between the maximum and minimum height of the surface of the substrate 10 in FIG. 9 approximately equaled b+c+d+e+f (the thicknesses of the dielectric 30, control gate 26, field oxide 20, floating gate 18 and protrusion of the field oxide 42). In contrast, as shown in FIG. 10, the variation in height between the maximum and minimum height of the surface of the substrate 110 approximately equals only d+e+f (the thicknesses of the floating gate 118, field oxide 120 and protrusion of the field oxide 42 above the gate oxide layer 114 surface). As such, it is much easier to focus the light beam used to expose the photoresist in the photolithographic sub-step of the patterning step, and the photo window need not be as narrow as in FIGS. 5 and 9. Likewise, the maximum thickness of poly 3 layer 132 to be etched away is only about a+d+e+f or 8,400 Å (the thicknesses of the poly 3 layer 132, the field oxide 120, the floating gate 118 and the field oxide 42), whereas in FIG. 9, it is a+b+c+d+e+f or over 12,000 Å. Accordingly, less over-etching is needed to remove poly 3 layer 132 stringers.

Note also that the poly 2 layer 124 covers the entire substrate 110 surface (most notably, the remaining tunnel oxide 114 is very thin after several etching steps. The gate oxide is formed during the additional oxide step for the CMOS gate oxide) during the poly 3 layer 132 patterning and the wet dip for removing the unwanted portions of the dielectric layer 130. Thus, the poly 2 layer 124 protects the underlying substrate and the structures formed thereon. This tends to avoid the above noted gate oxide undercut problem.

In addition, the upper capacitor plate 134 is smaller than, and entirely overlies a surface of, the lower capacitor plate 128. As may be appreciated, this so that the lower capacitor plate 128 can be formed after the upper capacitor plate 134.

The above discussion is intended to be merely illustrative of the invention. Those having ordinary skill in the art may devise numerous alternative embodiments without departing from the spirit and scope of the following claims.

The claimed invention is:

1. A process for fabricating a semiconductor device comprising the steps of:
   (a1) forming a gate oxide layer on said substrate surface, said lower polycrystalline silicon layer covering exposed portions of said gate oxide layer,
      (a) depositing a lower polycrystalline silicon layer on a substrate surface and on one or more structures that protrude from said substrate surface,
   (b) forming a dielectric layer on said lower polycrystalline silicon layer,
   (c) depositing an upper polycrystalline silicon layer on said dielectric layer,
   (d) patterning said upper polycrystalline silicon layer to form one or more upper capacitor plates,
   (e) wet etching away exposed portions of said dielectric layer not covered by said one or more upper capacitor plates, wherein said wet etching protects said gate oxide layer from damage,
   (f) after steps (d) and (e), patterning said lower polycrystalline silicon layer to form at least one or more lower capacitor plates, each lower capacitor plate underlying a corresponding one of said upper capacitor plates and a portion of said dielectric layer covered by said corresponding upper capacitor plate.

2. The process of claim 1 where one of said structures that protrudes from said substrate surface includes at least part of a nonvolatile memory cell.

3. The process of claim 1 wherein said upper capacitor plate has a smaller surface area than said lower capacitor plate.

4. The process of claim 1 wherein said step of patterning further forms a polycrystalline silicon region on each of one or more of said structures that protrude from said substrate surface.

5. The process of claim 4 wherein said polycrystalline silicon region is a control gate of a nonvolatile memory cell and said structure that protrudes from said substrate surface includes an oxide region formed on a floating gate.

6. The process of claim 4 wherein said particular sequence of steps, according to which step (f) follows step (d), reduces a variation in a topographical height of said substrate during step (d).

7. The process of claim 6 further comprising the step of:
   (g) during step (d), focusing a light beam on a surface of said substrate, said light beam being used to selectively expose a photoresist material coated on said substrate.

8. The process of claim 6 further comprising the step of:
   (g) during said step (d), etching away portions of said upper polycrystalline silicon layer other than said upper capacitor plates,
      wherein said reduction in variation in said topological height of said substrate reduces a maximum thickness, in a direction parallel to said height, of said portions of said upper polycrystalline silicon regions etched away during step (g).

9. A semiconductor integrated circuit comprising:
   (a) one or more semiconductor structures including:
      (a1) a first polycrystalline silicon region,
      (a2) a second polycrystalline silicon region which is more heavily doped than said first polycrystalline silicon region, formed at least partially over said first polycrystalline silicon region, and
   (b) a capacitor including:
      (b1) a lower capacitor plate comprising a polycrystalline silicon region doped with the same type of impurities as, and to the same doping concentration as, said second polycrystalline silicon region,
      (b2) a dielectric region formed on said lower capacitor plate, and
      (b3) an upper capacitor plate comprising a polycrystalline silicon region, formed on said dielectric region, said upper capacitor plate entirely overlying a surface of said lower capacitor plate.

* * * * *